United States Patent
Saito et al.

(10) Patent No.: US 8,933,920 B2
(45) Date of Patent: Jan. 13, 2015

(54) DISPLAY DEVICE AND METHOD OF DRIVING THE SAME

(75) Inventors: Nobuyoshi Saito, Kawasaki (JP);
Tomomasa Ueda, Yokohama (JP);
Yujiro Hara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 13/052,442

(22) Filed: Mar. 21, 2011

(65) Prior Publication Data

US 2011/0164025 A1 Jul. 7, 2011

Related U.S. Application Data

(63) Continuation of application No. PCT/JP2009/066171, filed on Sep. 16, 2009.

(30) Foreign Application Priority Data

Sep. 26, 2008 (JP) .................................. 2008-247258

(51) Int. Cl.
| | |
|---|---|
| *G06F 3/038* | (2013.01) |
| *G09G 5/00* | (2006.01) |
| *G09G 3/32* | (2006.01) |
| *H01L 51/00* | (2006.01) |
| *H01L 51/56* | (2006.01) |

(52) U.S. Cl.
CPC ............ *G09G 3/3233* (2013.01); *H01L 51/001* (2013.01); *H01L 51/0011* (2013.01); *G09G 2300/0819* (2013.01); *G09G 2300/0842* (2013.01); *G09G 2320/043* (2013.01); *H01L 51/56* (2013.01)
USPC ....................................................... 345/212

(58) Field of Classification Search
CPC .............. G09G 3/3233; G09G 3/3258; G09G 2300/0439; G09G 2300/0443; G09G 2300/0447; G09G 2300/0452; G09G 2300/0456; G09G 2300/046; G09G 2300/0465
USPC ....................................................... 345/212
See application file for complete search history.

(56) References Cited

U.S. PATENT DOCUMENTS

| | | | |
|---|---|---|---|
| 2003/0112205 A1* | 6/2003 | Yamada ......................... | 345/32 |
| 2004/0130560 A1* | 7/2004 | Matsueda et al. ............. | 345/692 |

(Continued)

FOREIGN PATENT DOCUMENTS

| | | |
|---|---|---|
| JP | 2003-099000 A | 4/2003 |
| JP | 2004-280059 A | 10/2004 |

(Continued)

OTHER PUBLICATIONS

G. Reza Chaji, et al., "Parallel Addressing Scheme for Voltage-Programmed Active-Matrix OLED Displays," IEEE Transactions on Electron Devices, vol. 54, No. 5, May 2007, pp. 1095-1100.

(Continued)

*Primary Examiner* — Joe H Cheng
*Assistant Examiner* — Michael J Jansen, II
(74) *Attorney, Agent, or Firm* — Oblon, Spivak, McClelland, Maier & Neustadt, L.L.P.

(57) ABSTRACT

A display device includes a plurality of pixel portions provided in a matrix form. Each of the pixel portions includes a pixel circuit and a light-emitting element. The pixel circuit includes a driving transistor connected between the light-emitting element and a first power supply line, a capacitor connected at its one end to a gate of the driving transistor, a switching transistor connected between the other end of the capacitor and a signal line, a threshold voltage detection transistor connected between a connecting point between the light-emitting element and the driving transistor, and a connecting point between the capacitor and the switching transistor, and a reset transistor connected between a connecting point between the driving transistor and the first power supply line, and a connecting point between the gate of the driving transistor and the capacitor, and connected at its gate to a reset control line.

9 Claims, 4 Drawing Sheets

(56) References Cited

U.S. PATENT DOCUMENTS

| | | |
|---|---|---|
| 2004/0174354 A1 | 9/2004 | Ono et al. |
| 2004/0201581 A1* | 10/2004 | Miyazawa .................... 345/204 |
| 2004/0257353 A1* | 12/2004 | Imamura et al. ............. 345/204 |
| 2005/0105031 A1* | 5/2005 | Shih et al. .................... 349/139 |
| 2005/0110720 A1* | 5/2005 | Akimoto et al. ............... 345/76 |
| 2005/0168491 A1* | 8/2005 | Takahara et al. ............. 345/690 |
| 2005/0180083 A1* | 8/2005 | Takahara et al. ............. 361/152 |
| 2005/0219170 A1* | 10/2005 | Seki ............................... 345/77 |
| 2005/0243036 A1* | 11/2005 | Ikeda ............................. 345/76 |
| 2006/0066531 A1* | 3/2006 | Park et al. ....................... 345/76 |
| 2006/0221010 A1* | 10/2006 | Omata ............................ 345/76 |
| 2006/0290614 A1 | 12/2006 | Nathan et al. |
| 2007/0063932 A1* | 3/2007 | Nathan et al. .................. 345/76 |
| 2007/0085782 A1* | 4/2007 | Matsumoto et al. ............ 345/76 |
| 2007/0273618 A1 | 11/2007 | Hsieh et al. |
| 2007/0296652 A1* | 12/2007 | Imamura et al. ................ 345/76 |
| 2008/0062092 A1* | 3/2008 | Kanda ............................. 345/77 |
| 2008/0180422 A1* | 7/2008 | Kusafuka et al. ............. 345/204 |
| 2008/0231560 A1* | 9/2008 | Yamashita et al. ............. 345/76 |
| 2008/0297449 A1* | 12/2008 | Yamashita et al. ............. 345/76 |
| 2009/0015571 A1* | 1/2009 | Kawasaki et al. ............. 345/204 |
| 2009/0027312 A1 | 1/2009 | Han et al. |
| 2010/0091041 A1* | 4/2010 | Ono ............................... 345/690 |
| 2010/0097334 A1* | 4/2010 | Choi et al. .................... 345/173 |
| 2010/0182303 A1* | 7/2010 | Takasugi et al. .............. 345/211 |
| 2010/0259563 A1* | 10/2010 | Tokuda et al. ................ 345/690 |

FOREIGN PATENT DOCUMENTS

| | | |
|---|---|---|
| JP | 2007-316639 A | 12/2007 |
| JP | 2009-25821 A | 2/2009 |
| WO | 2006/130981 A1 | 12/2006 |
| WO | 2007/030927 A1 | 3/2007 |
| WO | 2007/144976 A1 | 12/2007 |
| WO | WO 2008152793 A1 * | 12/2008 |
| WO | 2009/078166 A1 | 6/2009 |

OTHER PUBLICATIONS

International Search Report issued Oct. 27, 2009, in PCT/JP2009/066171, filed Sep. 16, 2009.

English translation of International Preliminary Report on Patentability and Written Opinion of the International Searching Authority issued May 19, 2011, in PCT/JP2009/066171.

* cited by examiner

DISPLAY DEVICE AND METHOD OF DRIVING THE SAME

TECHNICAL FIELD

The present invention relates to a display device and a method of driving the display device.

BACKGROUND ART

In recent years, an organic electroluminescence (EL) display device using OLEDs (organic light emitting diodes) which are self light-emitting elements has received attention as a flat display device, and thus has been developed actively. Since the OLEDs are self light-emitting elements, the organic EL display device has features such as no backlight required, a wide viewing angle, and fast response which is desirable for motion pictures, compared with a liquid crystal display device that controls the light intensity from a backlight by liquid crystal cells.

As with liquid crystal display devices, organic EL display devices can adopt, as their drive method, a simple (passive) matrix method and an active matrix method. Although a display device of the simple matrix method is simple in structure, the display device has a problem of, for example, having difficulty in implementing a large-area and high-resolution display device. Hence, in recent years, active development has been performed on display devices of the active matrix method that control a current flowing through a light-emitting element by an active element, e.g., a thin-film transistor (TFT), provided in the same pixel circuit as the circuit where the light-emitting element is provided.

In a display device of the active matrix method, each pixel is composed of an OLED serving as a display element; and a pixel circuit that supplies a drive current to the display element. An organic EL display device performs a display operation by controlling the luminance of the display elements. A pixel circuit includes, for example, a driving transistor connected in series with a display element; a switching transistor connected between a data line and a gate of the driving transistor; a capacitor connected between the gate and source of the driving transistor and holding a voltage according to a video signal; and the like.

Meanwhile, unlike a liquid crystal cell, an OLED is a current-driven type self light-emitting element. Thus, during a display operation, the driving transistor connected in series with the display element needs to be in an ON state all the time to allow a current to continuously flow. Therefore, with the passage of time, characteristic degradation of the driving transistors, such as a decrease in mobility and an increase in threshold voltage, is observed.

Such characteristic degradation of the transistors brings about a change in the amount of current during operation, which is recognized as variation in luminance or burn-in in each pixel of the organic EL display device. Particularly, transistors formed of amorphous silicon have a very high degree of threshold voltage shift, which is a great hindrance to practical use.

In recent years, a method has been proposed to form, in a pixel, a threshold voltage detection circuit that detects, a threshold voltage shift of a transistor formed of amorphous silicon (see, for example, Non-Patent Document 1). In this technique, by providing, in each pixel, a threshold voltage detection transistor that can short-circuit between the gate and drain of a driving transistor, a gate voltage is discharged during a threshold voltage detection period provided separately from light emission time, so that a threshold voltage of the driving transistor can be stored as a potential at the other end of a holding capacitance.

In the above-described threshold voltage detection circuit, as a preparation operation to detect a threshold voltage, the operation of bringing the gate potential of the driving transistor to a sufficiently high potential (reset operation) is required. Normally, in the reset operation, by turning on the threshold voltage detection transistor to raise the potential of a power supply potential Vss, a current flows through the driving transistor in an opposite direction to that for light emission and the gate of the driving transistor is charged through the threshold voltage detection transistor.

In such a pixel structure, however, the ease of current flow through the driving transistor itself affects the charge of the gate potential of the driving transistor. Therefore, if a threshold voltage shift of the driving transistor occurs and thus the current supply capability of the driving transistor decreases, the potential at which the gate is reset also decreases, causing an error in the accuracy of compensation for a threshold voltage shift of the driving transistor.

PRIOR ART DOCUMENT

Non-patent document

Non-Patent Document 1: G. R. Chaji et al, IEEE, Trans. Electron Device, 2007, vol 54, p 1095

DISCLOSURE OF THE INVENTION

Problems to be Solved by the Invention

An object of the present invention is to provide a display device that can maintain excellent display performance over an extended period of time by improving the accuracy of compensation for a threshold voltage shift of a driving transistor which controls a current supplied to a current-driven type self light-emitting element, and to provide a method of driving the display device.

Means for Solving the Problems

A display device according to one aspect of the present invention comprises: a plurality of signal lines; a plurality of control lines, each of which includes a scanning line, a reset control line, a threshold voltage detection control line, and a first power supply line; and a plurality of pixel portions provided in a matrix form, each of the pixel portions including a pixel circuit to which any one of the plurality of signal lines and any one of the plurality of control lines are connected and a light-emitting element to which a second power supply line is connected and which emits light according to a current supplied thereto. In the display device, the pixel circuit includes: a driving transistor connected at one of its source and drain to the light-emitting element, and connected at an other one of its source and drain to a corresponding first power supply line; a capacitor connected at its one end to a gate of the driving transistor; a switching transistor connected at one of its source and drain to an other end of the capacitor, connected at an other one of its source and drain to the signal line, and connected at its gate to a corresponding scanning line; a threshold voltage detection transistor connected between a connecting point between the light-emitting element and the driving transistor, and a connecting point between the capacitor and the switching transistor, and connected at its gate to a corresponding threshold voltage detection control line; and a reset transistor connected between a connecting point between the driving transistor and the first power supply line, and a connecting point between the gate of the driving transistor and the capacitor, and connected at its gate to a corresponding reset control line.

A method of driving a display device according to another aspect of the present invention is a method of driving a display device including a plurality of pixel portions provided in a matrix form, each of the pixel portions including: an n-type driving transistor connected at one of its source and drain to a first power supply line; a light-emitting element connected at its anode to a second power supply line through which a positive power supply potential is supplied, and connected at its cathode to an other one of the source and drain of the driving transistor, and emitting light according to a current supplied thereto; a capacitor connected at its one end to a gate of the driving transistor; a switching transistor connected at one of its source and drain to an other end of the capacitor, and connected at an other one of its source and drain to a signal line through which a potential according to a video signal is applied; a threshold voltage detection transistor connected between a connecting point between the light-emitting element and the driving transistor, and a connecting point between the capacitor and the switching transistor; and a reset transistor connected between a connecting point between the driving transistor and the first power supply line, and a connecting point between the gate of the driving transistor and the capacitor, the method comprising: placing the reset transistor and the threshold voltage detection transistor in an on state and placing the switching transistor in an off state to supply a first potential through the first power supply line, whereby the driving transistor is reset, the first potential being higher than the positive power supply potential; placing the threshold voltage detection transistor in an on state and placing the reset transistor and the switching transistor in an off state to supply a second potential through the first power supply line, whereby a potential difference between both ends of the capacitor is set as a threshold voltage of the driving transistor, the second potential being equal to the positive power supply potential; placing the switching transistor in an on state and placing the reset transistor and the threshold voltage detection transistor in an off state to supply the second potential through the first power supply line, whereby potentials at both ends of the capacitor are increased by an amount according to the video signal; and placing the reset transistor, the threshold voltage detection transistor, and the switching transistor in an off state to supply a third potential through the first power supply line, whereby the light-emitting element is allowed to emit light, the third potential being lower than the positive power supply potential.

A method of driving a display device according to still another aspect of the present invention is a method of driving a display device including a plurality of pixel portions provided in a matrix form, each of the pixel portions including: a p-type driving transistor connected at one of its source and drain to a first power supply line; a light-emitting element connected at its cathode to a second power supply line through which a negative power supply potential is supplied, and connected at its anode to an other one of the source and drain of the driving transistor, and emitting light according to a current supplied thereto; a capacitor connected at its one end to a gate of the driving transistor; a switching transistor connected at one of its source and drain to an other end of the capacitor, and connected at an other one of its source and drain to a signal line through which a potential according to a video signal is applied; a threshold voltage detection transistor connected between a connecting point between the light-emitting element and the driving transistor, and a connecting point between the capacitor and the switching transistor; and a reset transistor connected between a connecting point between the driving transistor and the first power supply line, and a connecting point between the gate of the driving transistor and the capacitor, the method comprising: placing the reset transistor and the threshold voltage detection transistor in an on state and placing the switching transistor in an off state to supply a first potential through the first power supply line, whereby the driving transistor is reset, the first potential being lower than the negative power supply potential; placing the threshold voltage detection transistor in an on state and placing the reset transistor and the switching transistor in an off state to supply a second potential through the first power supply line, whereby a potential difference between both ends of the capacitor is set as a threshold voltage of the driving transistor, the second potential being equal to the negative power supply potential; placing the switching transistor in an on state and placing the reset transistor and the threshold voltage detection transistor in an off state to supply the second potential through the first power supply line, whereby potentials at both ends of the capacitor are increased by an amount according to the video signal; and placing the reset transistor, the threshold voltage detection transistor, and the switching transistor in an off state to supply a third potential through the first power supply line, whereby the light-emitting element is allowed to emit light, the third potential being higher than the negative power supply potential.

Effect of the Invention

According to the present invention, by improving the accuracy of compensation for a threshold voltage shift of a driving transistor that controls a current supplied to a current-driven type self light-emitting element, excellent display performance can be maintained over an extended period of time.

MODE FOR CARRYING OUT THE INVENTION

Embodiments of the present invention will be described below based on the drawings.

Figure 1:
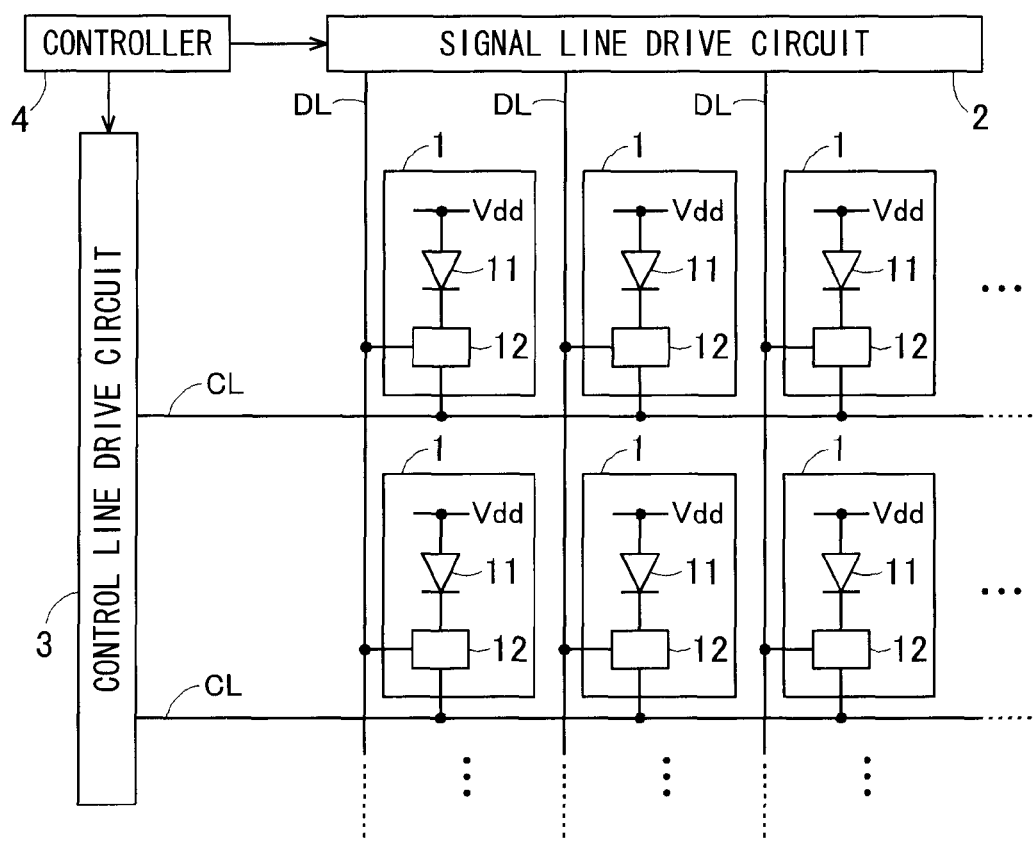
FIG. 1 is a plan view of a display device according to a first embodiment of the present invention.

(First Embodiment) FIG. 1 is a plan view of a display device according to a first embodiment of the present invention. The display device includes a plurality of pixel portions 1 provided in a matrix form, a signal line drive circuit 2, a control line drive circuit 3, a controller 4, a plurality of signal lines DL, and a plurality of control lines CL.

The signal lines DL are provided in a column direction in the drawing, and each signal line DL is connected to pixel portions 1 of a corresponding column. The control lines CL are provided in a row direction in the drawing, and each control line CL is connected to pixel portions 1 of a corresponding row. Each control line CL includes a scanning line, a reset control line, a threshold voltage detection control line, and a negative power line. These lines will be described later.

The signal line drive circuit 2 supplies a signal voltage appropriate for a video signal to a pixel portion 1 through a corresponding signal line DL. The control line drive circuit 3 supplies a scanning line drive signal, a reset control signal, a threshold voltage detection signal, and a negative power supply voltage to a pixel portion 1 through a corresponding control line CL (a scanning line, a reset control line, a threshold voltage detection control line, and a negative power line).

Each pixel portion 1 includes a light-emitting element (e.g., an organic EL element) 11 that emits light according to a current to be supplied thereto; and a pixel circuit 12 that controls the light emission of the light-emitting element 11. A positive power supply voltage Vdd is supplied to the light-emitting element 11. A corresponding signal line DL and a corresponding control line CL are connected to the pixel circuit 12.

The controller 4 performs timing control of the operations of the signal line drive circuit 2 and the control line drive circuit 3.

Figure 2:
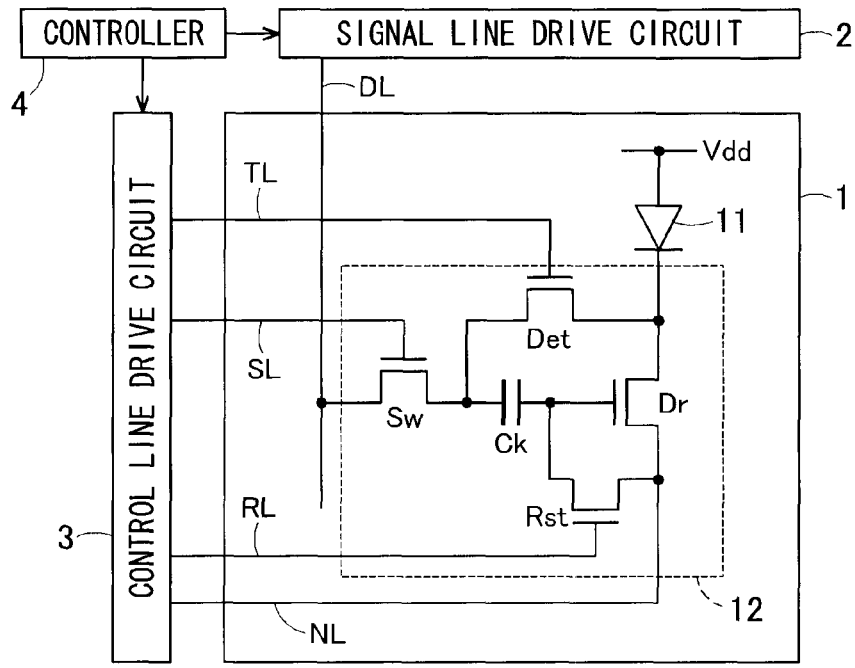
FIG. 2 is a schematic configuration diagram of a pixel portion in the display device according to the first embodiment.

FIG. 2 shows a schematic configuration of a pixel portion 1. A pixel circuit 12 in the pixel portion 1 includes a switching transistor Sw, a threshold voltage detection transistor Det, a driving transistor Dr, a reset transistor Rst, and a capacitor Ck. Here, the switching transistor Sw, the threshold voltage detection transistor Det, the driving transistor Dr, and the reset transistor Rst are n-type thin-film transistors (TFTs).

A positive power supply voltage Vdd is provided to an anode of a light-emitting element 11. A cathode of the light-emitting element 11 is connected to a drain of the driving transistor Dr. A source of the driving transistor Dr is connected to a negative power line NL. One end of the capacitor Ck is connected to a gate of the driving transistor Dr.

The switching transistor Sw is connected between the other end of the capacitor Ck and a signal line DL. A scanning line SL is connected to a gate of the switching transistor Sw. Therefore, turning on and off of the switching transistor Sw is controlled based on a scanning line drive signal outputted from the control line drive circuit 3.

The threshold voltage detection transistor Det is connected between a connecting point between the capacitor Ck and the switching transistor Sw, and a connecting point between the driving transistor Dr and the light-emitting element 11. A threshold voltage detection control line TL is connected to a gate of the threshold voltage detection transistor Det. Therefore, turning on and off of the threshold voltage detection transistor Det is controlled based on a threshold voltage detection control signal outputted from the control line drive circuit 3.

The reset transistor Rst is connected between a connecting point between the capacitor Ck and the gate of the driving transistor Dr, and the source of the driving transistor Dr. A reset control line RL is connected to a gate of the reset transistor Rst. Therefore, turning on and off of the reset transistor Rst is controlled based on a reset control signal outputted from the control line drive circuit 3.

Figure 3:
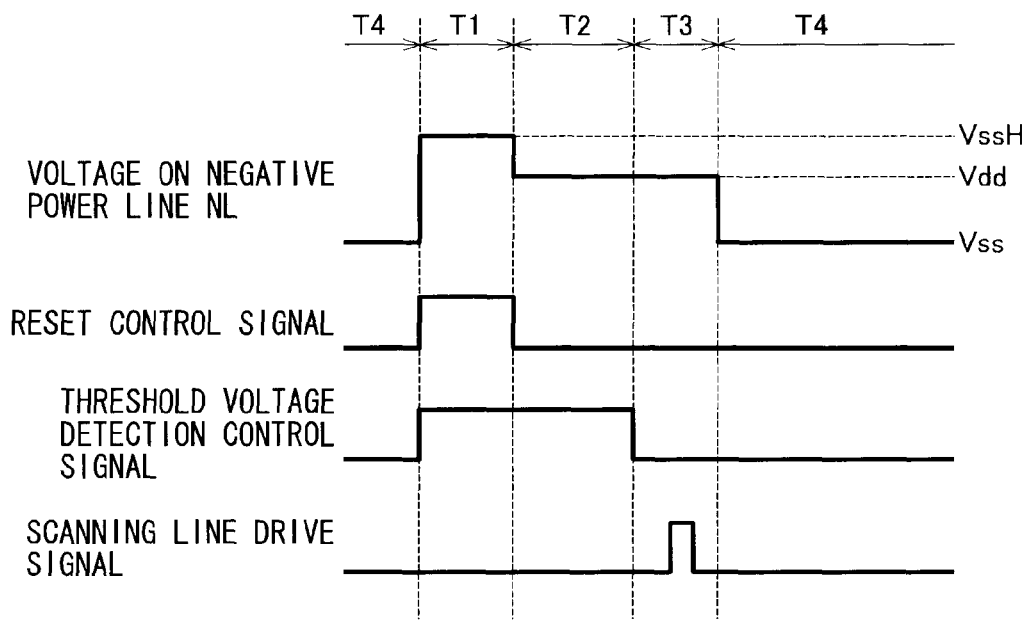
FIG. 3 is a timing chart describing a method of driving a pixel circuit in the display device according to the first embodiment.

A method of driving the pixel circuit 12 by the control line drive circuit 3 will be described using a timing chart shown in FIG. 3. The operation of the pixel circuit 12 is divided into a reset period T1, a threshold voltage detection period T2, a signal writing period T3, and a light emission period T4. FIG. 3 is a timing chart of the scanning line drive signal, the reset control signal, the threshold voltage detection signal, and the voltage on the negative power line NL during each period.

During the reset period T1, the values of the reset control signal and the threshold voltage detection signal rise, placing the reset transistor Rst and the threshold voltage detection transistor Det in an on state. In addition, the potential of the negative power line NL rises to VssH (>Vdd) which is higher than a positive power supply potential Vdd.

Figure 4:
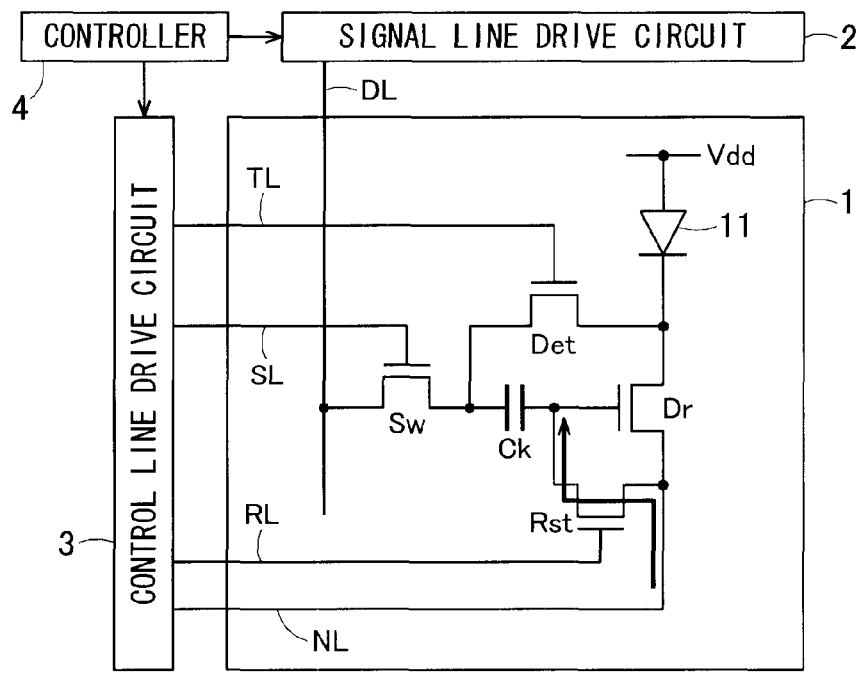
FIG. 4 is a circuit diagram showing a charge path for a gate of a driving transistor during a reset period.

Accordingly, the gate of the driving transistor Dr is charged to the negative power line potential VssH through a path, for example, via the reset transistor Rst as shown in FIG. 4. Since the driving transistor Dr is not present in the charge path for the gate of the driving transistor Dr, the ease of current flow through the driving transistor Dr itself does not affect the charge of the gate potential of the driving transistor Dr.

In addition, at this time, the potential at the other end of the capacitor Ck (on the side of the switching transistor Sw) reaches VssH–Vth (Vth represents a threshold voltage of the driving transistor Dr).

During the threshold voltage detection period T2, the value of the reset control signal drops, turning off the reset transistor Rst. There is no change in the value of the threshold voltage detection signal and thus the threshold voltage detection transistor Det remains in the on state. The potential of the negative power line NL drops to the positive power supply voltage Vdd.

Accordingly, the discharge of the charge at the other end of the capacitor Ck proceeds through the threshold voltage detection transistor Det being in the on state, until the gate potential of the driving transistor Dr reaches Vdd+Vth.

By allowing the value of the threshold voltage detection signal to drop to turn off the threshold voltage detection transistor Det, the threshold voltage detection period T2 ends. At the time when the threshold voltage detection period T2 ends, the potential at the other end of the capacitor Ck reaches Vdd and the threshold voltage Vth of the driving transistor Dr is recorded at both ends of the capacitor Ck.

During the signal writing period T3, the value of the scanning line drive signal rises at predetermined timing, turning on the switching transistor Sw. Due to the switching transistor Sw being turned on, a voltage on the signal line DL (a signal voltage appropriate for a video signal) Vdata is written into the other end of the capacitor Ck through the switching transistor Sw.

At this time, since the reset transistor Rst and the threshold voltage detection transistor Det are turned off and thus a potential difference between both ends of the capacitor Ck is maintained, the gate potential of the driving transistor Dr reaches Vdd+Vth+Vdata.

During the light emission period T4, the potential of the negative power line NL drops to a negative power supply voltage Vss, and thus, a potential difference occurs in the light-emitting element 11 in a forward direction, whereby light emission of the light-emitting element 11 starts. Here, the current flowing through the light-emitting element 11 can be regarded as the current flowing through the driving transistor Dr.

In general, a current I flowing through a transistor can be expressed by:

$$I = \mu n C_{ox} W (V_{gs} - V_t)2/2L \quad \text{(Equation 1)}$$

where the gate-source voltage of the transistor is represented by Vgs, the threshold voltage by Vt, the gate length by L, the gate width by W, the gate capacitance by Cox, and the mobility of electrons by μn.

In the present embodiment, at the time when the signal writing period T3 ends, the gate potential of the driving transistor Dr reaches Vdd+Vth+Vdata. From the above-described Equation 1, the term "threshold voltage Vth" of the driving transistor Dr is cancelled out. Thus, it can be seen that the current flowing through the light-emitting element 11 is not affected by the threshold voltage Vth of the driving transistor Dr.

As such, in the display device according to the present embodiment, by directly connecting the gate of the driving transistor to the negative power line through the reset transistor, the gate potential of the driving transistor can be charged at a constant level, regardless of the amount of threshold voltage shift occurring in the driving transistor. In addition, the drain and gate of the driving transistor are connected through the capacitor to detect a threshold voltage of the driving transistor. Hence, the accuracy of compensation for a threshold voltage shift is improved, enabling to maintain excellent display performance over an extended period of time.

In addition, since the detection of a threshold voltage of the driving transistor is performed through the capacitor, the potential at the other end of the capacitor after the detection operation can be brought to a constant value. Accordingly, a reference control line and a circuit device, such as a reference transistor, that allow the other end of the capacitor to maintain a constant voltage during a threshold voltage detection operation can be eliminated, which is desirable for achieving an increased size and an improved resolution.

Although, in the present embodiment, the switching transistor Sw, the threshold voltage detection transistor Det, and the reset transistor Rst are n-type transistors, p-type transistors may be used. In that case, the control line drive circuit 3 outputs signals which are polarity-inverted versions of the scanning line control signal, the threshold voltage detection control signal, and the reset control signal shown in FIG. 3.

(Second Embodiment) A display device according to a second embodiment of the present invention will be described. A plan view of the display device according to the present embodiment has the same configuration as that of a display device according to the first embodiment shown in FIG. 1, and thus, description thereof will not be repeated.

However, note that although, in the first embodiment, a control line CL includes a negative power line and a control line drive circuit 3 supplies a negative power supply voltage to a pixel portion 1 through the negative power line, in the present embodiment, a control line CL includes a positive power line instead of a negative power line and a control line drive circuit 3 supplies a positive power supply voltage to a pixel portion 1 through the positive power line. Note also that the cathode of a light-emitting element 11 is connected to a negative power line which supplies a negative power supply voltage Vss.

Figure 5:
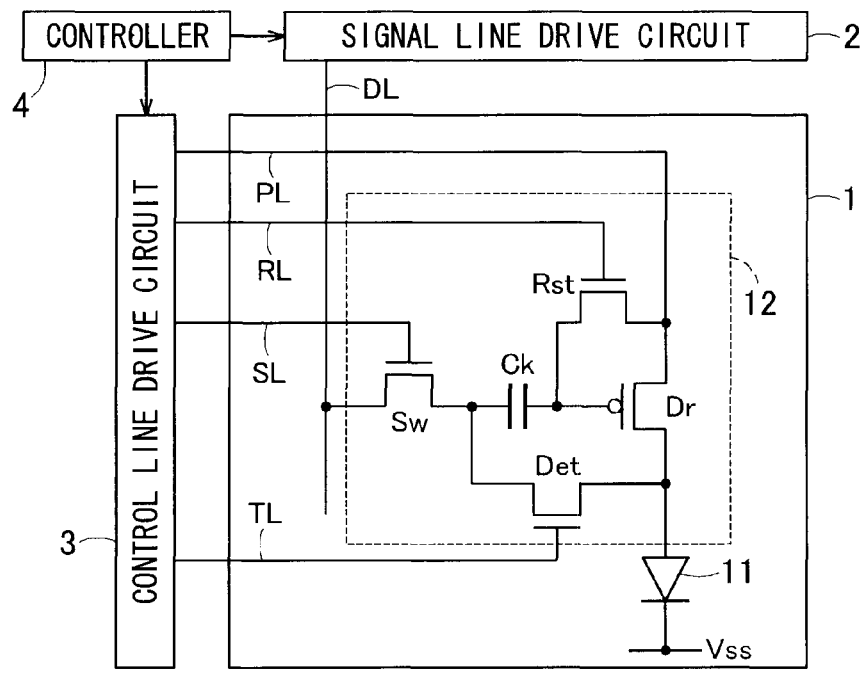
FIG. 5 is a schematic configuration diagram of a pixel portion in a display device according to a second embodiment of the present invention.

FIG. 5 shows a schematic configuration of the pixel portion 1. A pixel circuit 12 in the pixel portion 1 includes a switching transistor Sw, a threshold voltage detection transistor Det, a driving transistor Dr, a reset transistor Rst, and a capacitor Ck. The driving transistor Dr is a p-type thin-film transistor (TFT). Here, the switching transistor Sw, the threshold voltage detection transistor Det, and the reset transistor Rst are n-type TFTs.

A negative power supply voltage Vss is provided to the cathode of the light-emitting element 11. An anode of the light-emitting element 11 is connected to a drain of the driving transistor Dr. A source of the driving transistor Dr is connected to a positive power line PL. One end of the capacitor Ck is connected to a gate of the driving transistor Dr.

The switching transistor Sw is connected between the other end of the capacitor Ck and a signal line DL. A scanning line SL is connected to a gate of the switching transistor Sw. Therefore, turning on and off of the switching transistor Sw is controlled based on a scanning line drive signal outputted from the control line drive circuit 3.

The threshold voltage detection transistor Det is connected between a connecting point between the capacitor Ck and the switching transistor Sw, and a connecting point between the driving transistor Dr and the light-emitting element 11. A threshold voltage detection control line TL is connected to a gate of the threshold voltage detection transistor Det. Therefore, turning on and off of the threshold voltage detection transistor Det is controlled based on a threshold voltage detection control signal outputted from the control line drive circuit 3.

The reset transistor Rst is connected between a connecting point between the capacitor Ck and the gate of the driving transistor Dr, and the source of the driving transistor Dr. A reset control line RL is connected to a gate of the reset transistor Rst. Therefore, turning on and off of the reset transistor Rst is controlled based on a reset control signal outputted from the control line drive circuit 3.

Figure 6:
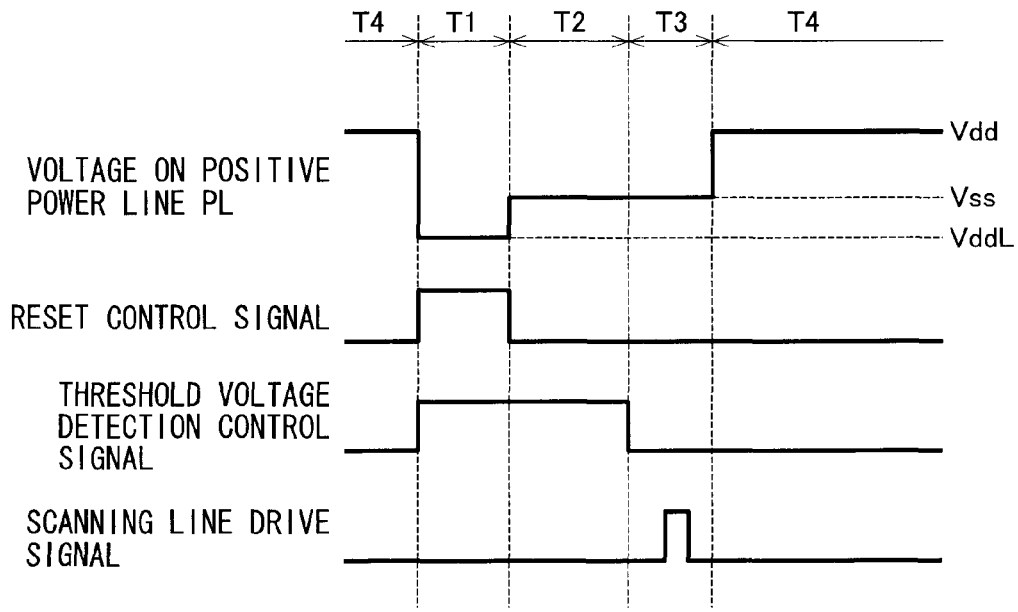
FIG. 6 is a timing chart describing a method of driving a pixel circuit in the display device according to the second embodiment.

A method of driving the pixel circuit 12 by the control line drive circuit 3 will be described using a timing chart shown in FIG. 6. The operation of the pixel circuit 12 is divided into a reset period T1, a threshold voltage detection period T2, a signal writing period T3, and a light emission period T4. FIG. 6 is a timing chart of the scanning line drive signal, the reset control signal, the threshold voltage detection signal, and the positive power supply voltage during each period.

During the reset period T1, the values of the reset control signal and the threshold voltage detection signal rise, placing the reset transistor Rst and the threshold voltage detection transistor Det in an on state. In addition, the potential of the positive power line PL drops to VddL (<Vss) which is lower than a negative power supply voltage Vss.

Figure 7:
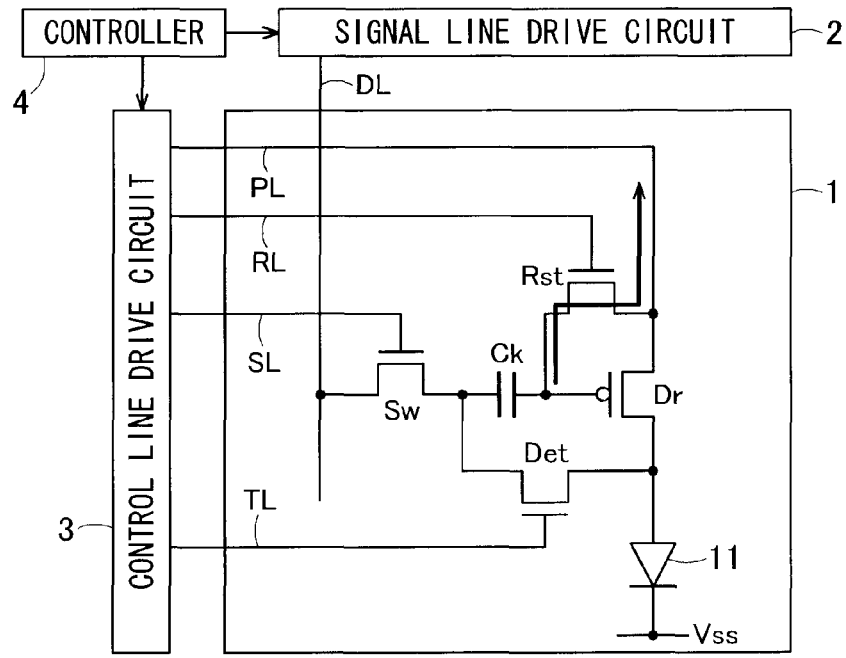
FIG. 7 is a circuit diagram showing a discharge path for a gate of a driving transistor during a reset period.

Accordingly, the gate of the driving transistor Dr is discharged to the positive power line potential VddL through a path, for example, via the reset transistor Rst as shown in FIG. 7. Since the driving transistor Dr is not present in the discharge path for the gate of the driving transistor Dr, the ease of current flow through the driving transistor Dr itself does not affect the discharge of the gate potential of the driving transistor Dr.

In addition, at this time, the potential at the other end of the capacitor Ck (on the side of the switching transistor Sw) reaches VddL+Vth (Vth represents a threshold voltage of the driving transistor Dr, and Vth<0).

During the threshold voltage detection period T2, the value of the reset control signal drops, turning off the reset transistor Rst. There is no change in the value of the threshold voltage detection signal and thus the threshold voltage detection transistor Det remains in the on state. The potential of the positive power line PL rises to the negative power supply voltage Vss.

Accordingly, charging of the charge at the other end of the capacitor Ck proceeds through the threshold voltage detection transistor Det being in the on state, until the gate potential of the driving transistor Dr reaches Vss+Vth.

By allowing the value of the threshold voltage detection signal to drop to turn off the threshold voltage detection transistor Det, the threshold voltage detection period T2 ends. At the time when the threshold voltage detection period T2 ends, the potential at the other end of the capacitor Ck reaches Vss and the threshold voltage Vth of the driving transistor Dr is recorded at both ends of the capacitor Ck.

During the signal writing period T3, the value of the scanning line drive signal rises at predetermined timing, turning on the switching transistor Sw. Due to the switching transistor Sw being turned on, a voltage on the signal line DL (a signal voltage appropriate for a video signal) Vdata is written into the other end of the capacitor Ck through the switching transistor Sw.

At this time, since the reset transistor Rst and the threshold voltage detection transistor Det are turned off and thus a potential difference between both ends of the capacitor Ck is maintained, the gate potential of the driving transistor Dr reaches Vss+Vth+Vdata.

During the light emission period T4, the potential of the positive power line PL rises to a positive power supply voltage Vdd, and thus, a potential difference occurs in the light-emitting element 11 in a forward direction, whereby light emission of the light-emitting element 11 starts. Here, the current flowing through the light-emitting element 11 can be regarded as the current flowing through the driving transistor Dr.

In the present embodiment, at the time when the signal writing period T3 ends, the gate potential of the driving transistor Dr reaches Vss+Vth+Vdata. From Equation 1 described in the first embodiment, the term "threshold voltage Vth" of the driving transistor Dr is cancelled out. Thus, it can be seen that the current flowing through the light-emitting element 11 is not affected by the threshold voltage Vth of the driving transistor Dr.

As such, in the display device according to the present embodiment, by directly connecting the gate of the driving transistor to the positive power line through the reset transistor, the gate potential of the driving transistor can be charged at a constant level, regardless of the amount of threshold voltage shift occurring in the driving transistor. In addition, the drain and gate of the driving transistor are connected through the capacitor to detect a threshold voltage of the driving transistor. Hence, the accuracy of compensation for a threshold voltage shift is improved, enabling to maintain excellent display performance over an extended period of time.

In addition, since the detection of a threshold voltage of the driving transistor is performed through the capacitor, the potential at the other end of the capacitor after the detection operation can be brought to a constant value. Accordingly, a reference control line and a circuit device, such as a reference transistor, that allow the other end of the capacitor to maintain a constant voltage during a threshold voltage detection operation can be eliminated, which is desirable for achieving an increased size and an improved resolution.

Although, in the present embodiment, the switching transistor Sw, the threshold voltage detection transistor Det, and the reset transistor Rst are n-type transistors, p-type transistors may be used. In that case, the control line drive circuit 3 outputs signals which are polarity-inverted versions of the scanning line control signal, the threshold voltage detection control signal, and the reset control signal shown in FIG. 6.

For transistors included in a pixel circuit in the above-described embodiments, amorphous silicon, low-temperature polysilicon, microcrystalline silicon, organic semiconductors, oxide semiconductors, and the like can be used.

For light-emitting elements in the above-described embodiments, not only organic EL elements but also current-driven type light-emitting elements whose light emission luminance change according to the current value, such as charge injection type inorganic EL elements or electrochemical light-emitting elements, can be used.

Note that the present invention is not strictly limited to the above-described embodiments and can be embodied in an implementing stage by modifying the components without departing from the spirit and scope thereof. Note also that various embodiments of the invention can be formed by appropriately combining a plurality of components disclosed in the embodiments. For example, some of all the components shown in the embodiments may be eliminated. Furthermore, components shown in the different embodiments may be appropriately combined.

DESCRIPTION OF REFERENCE NUMERALS

1: Pixel Portion
2: Signal Line Drive Circuit
3: Control Line Drive Circuit
4: Controller
11: Light-Emitting Element
12: Pixel Circuit
Sw: Switching Transistor
Det: Threshold Voltage Detection Transistor
Dr: Driving Transistor
Rst: Reset Transistor
Ck: Capacitor
SL: Scanning Line
RL: Reset Control Line
TL: Threshold Voltage Detection Control Line
NL: Negative Power Line
PL: Positive Power Line

The invention claimed is:

1. A display device comprising:
a plurality of signal lines;
a plurality of control lines, each of which includes a scanning line, a reset control line, a threshold voltage detection control line, and a first power supply line; and
a plurality of pixel portions provided in a matrix form, each of the pixel portions including a pixel circuit to which any one of the plurality of signal lines and any one of the plurality of control lines are connected; and a light-emitting element to which a second power supply line is connected and which emits light according to a current supplied thereto, wherein
the pixel circuit includes:
a driving transistor directly connected at its drain to the light-emitting element, and directly connected at its source to a corresponding first power supply line;
a capacitor connected at its one end to a gate of the driving transistor;
a switching transistor directly connected to an other end of the capacitor, directly connected to the signal line, and connected at its gate to a corresponding scanning line;
a threshold voltage detection transistor directly connected between the light-emitting element and the driving transistor, and directly connected between the capacitor and the switching transistor, and connected at its gate to a corresponding threshold voltage detection control line; and
a reset transistor directly connected between the driving transistor and the first power supply line, the gate of the driving transistor and the capacitor, and connected at its gate to a corresponding reset control line.

2. The display device according to claim 1, further comprising a control line drive circuit that outputs a scanning line drive signal through the scanning line to perform on/off control of the switching transistor, outputs a reset signal through the reset control line to perform on/off control of the reset transistor, outputs a threshold voltage detection control signal through the threshold voltage detection control line to perform on/off control of the threshold voltage detection transistor, and applies a first to a third potential to a connecting point between the driving transistor and the reset transistor through the first power supply line.

3. The display device according to claim 2, wherein the driving transistor is of an n-type, and the light-emitting element is connected at its anode to the second power supply line and connected at its cathode to the driving transistor.

4. The display device according to claim 3, wherein the control line drive circuit:
   places the reset transistor and the threshold voltage detection transistor in an on state and places the switching transistor in an off state during a first period to apply the first potential through the first power supply line, the first potential being higher than a positive power supply potential supplied to the light-emitting element through the second power supply line;
   places the threshold voltage detection transistor in an on state and places the reset transistor and the switching transistor in an off state during a second period to apply the second potential through the first power supply line, the second potential being equal to the positive power supply potential;
   places the switching transistor in an on state and places the reset transistor and the threshold voltage detection transistor in an off state during a third period to apply the second potential through the first power supply line; and
   places the reset transistor, the threshold voltage detection transistor, and the switching transistor in an off state during a fourth period to apply the third potential through the first power supply line, the third potential being lower than the positive power supply potential.

5. The display device according to claim 2, wherein the driving transistor is of a p-type, and the light-emitting element is connected at its cathode to the second power supply line and connected at its anode to the driving transistor.

6. The display device according to claim 5, wherein the control line drive circuit:
   places the reset transistor and the threshold voltage detection transistor in an on state and places the switching transistor in an off state during a first period to apply the first potential through the first power supply line, the first potential being lower than a negative power supply potential supplied to the light-emitting element through the second power supply line;
   places the threshold voltage detection transistor in an on state and places the reset transistor and the switching transistor in an off state during a second period to apply the second potential through the first power supply line, the second potential being equal to the negative power supply potential;
   places the switching transistor in an on state and places the reset transistor and the threshold voltage detection transistor in an off state during a third period to apply the second potential through the first power supply line; and
   places the reset transistor, the threshold voltage detection transistor, and the switching transistor in an off state during a fourth period to apply the third potential through the first power supply line, the third potential being higher than the negative power supply potential.

7. The display device according to claim 2, further comprising a signal line drive circuit that applies a potential according to a video signal to the switching transistor through the signal line.

8. A method of driving a display device including a plurality of pixel portions provided in a matrix form, each of the pixel portions including:
   an n-type driving transistor directly connected at its source to a first power supply line;
   a light-emitting element connected at its anode to a second power supply line through which a positive power supply potential is supplied, and connected at its cathode to the drain of the driving transistor, and emitting light according to a current supplied thereto;
   a capacitor connected at its one end to a gate of the driving transistor;
   a switching transistor directly connected to an other end of the capacitor, and directly connected a signal line through which a potential according to a video signal is applied;
   a threshold voltage detection transistor directly connected between the light-emitting element and the driving transistor, and directly connected between the capacitor and the switching transistor; and
   a reset transistor directly connected between the driving transistor and the first power supply line, and between the gate of the driving transistor and the capacitor, the method comprising:
   placing the reset transistor and the threshold voltage detection transistor in an on state and placing the switching transistor in an off state to supply a first potential through the first power supply line, whereby the driving transistor is reset, the first potential being higher than the positive power supply potential;
   placing the threshold voltage detection transistor in an on state and placing the reset transistor and the switching transistor in an off state to supply a second potential through the first power supply line, whereby a potential difference between both ends of the capacitor is set as a threshold voltage of the driving transistor, the second potential being equal to the positive power supply potential;
   placing the switching transistor in an on state and placing the reset transistor and the threshold voltage detection transistor in an off state to supply the second potential through the first power supply line, whereby potentials at both ends of the capacitor are increased by an amount according to the video signal; and
   placing the reset transistor, the threshold voltage detection transistor, and the switching transistor in an off state to supply a third potential through the first power supply line, whereby the light-emitting element is allowed to emit light, the third potential being lower than the positive power supply potential.

9. A method of driving a display device including a plurality of pixel portions provided in a matrix form, each of the pixel portions including:
   a p-type driving transistor directly connected at its source to a first power supply line;
   a light-emitting element connected at its cathode to a second power supply line through which a negative power supply potential is supplied, and connected at its anode to the drain of the driving transistor, and emitting light according to a current supplied thereto;
   a capacitor connected at its one end to a gate of the driving transistor;
   a switching transistor directly connected to an other end of the capacitor, and directly connected to a signal line through which a potential according to a video signal is applied;

a threshold voltage detection transistor directly connected between the light-emitting element and the driving transistor, and directly connected between the capacitor and the switching transistor; and a reset transistor directly connected between the driving transistor and the first power supply line, and between the gate of the driving transistor and the capacitor, the method comprising:

placing the reset transistor and the threshold voltage detection transistor in an on state and placing the switching transistor in an off state to supply a first potential through the first power supply line, whereby the driving transistor is reset, the first potential being lower than the negative power supply potential;

placing the threshold voltage detection transistor in an on state and placing the reset transistor and the switching transistor in an off state to supply a second potential through the first power supply line, whereby a potential difference between both ends of the capacitor is set as a threshold voltage of the driving transistor, the second potential being equal to the negative power supply potential;

placing the switching transistor in an on state and placing the reset transistor and the threshold voltage detection transistor in an off state to supply the second potential through the first power supply line, whereby potentials at both ends of the capacitor are increased by an amount according to the video signal; and placing the reset transistor, the threshold voltage detection transistor, and the switching transistor in an off state to supply a third potential through the first power supply line, whereby the light-emitting element is allowed to emit light, the third potential being higher than the negative power supply potential.

* * * * *